(12) United States Patent
Kwon et al.

(10) Patent No.: US 7,561,603 B2
(45) Date of Patent: Jul. 14, 2009

(54) INTEGRATED SEMICONDUCTOR LIGHT SOURCE

(75) Inventors: Oh Kee Kwon, Daejeon (KR); Kwang Ryong Oh, Daejeon (KR); Kang Ho Kim, Daejeon (KR); Jong Hoi Kim, Daejeon (KR); Hyun Soo Kim, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 214 days.

(21) Appl. No.: 11/176,743

(22) Filed: Jul. 7, 2005

(65) Prior Publication Data

US 2006/0126693 A1    Jun. 15, 2006

(30) Foreign Application Priority Data

Dec. 14, 2004    (KR) .................... 10-2004-0105678

(51) Int. Cl.
*H01S 3/10*        (2006.01)
*H01S 3/098*       (2006.01)

(52) U.S. Cl. .......................................... 372/20; 372/18
(58) Field of Classification Search .................. None
See application file for complete search history.

(56) References Cited

U.S. PATENT DOCUMENTS

| | | | | |
|---|---|---|---|---|
| 4,719,636 | A * | 1/1988 | Yamaguchi | 372/50.121 |
| 4,794,608 | A | 12/1988 | Fujita et al. | |
| 5,058,121 | A * | 10/1991 | Paoli | 372/50.123 |
| 5,321,714 | A * | 6/1994 | Paoli | 372/50.22 |
| 5,379,309 | A | 1/1995 | Logan, Jr. | |
| 5,844,929 | A * | 12/1998 | Lealman et al. | 372/45.01 |
| 6,330,388 | B1 * | 12/2001 | Bendett et al. | 385/132 |
| 6,519,270 | B1 | 2/2003 | Kim et al. | |
| 2003/0206740 | A1 | 11/2003 | Lee et al. | |

FOREIGN PATENT DOCUMENTS

| | | |
|---|---|---|
| EP | 0375021 | 6/1990 |
| JP | 59 61086 | 4/1984 |
| JP | 09-043556 A | 2/1997 |
| JP | 2002-324936 A | 11/2002 |
| JP | 2003-66389 A | 3/2003 |
| KR | 10-2004 0007352 | 1/2004 |
| WO | WO 2004 028047 | 4/2004 |

OTHER PUBLICATIONS

"A Low-Cost WDM Source with an ASE Injected Fabry-Perot Semiconductor Laser" Kim et al., IEEE Photonics Technology Letters, vol. 12, No. 8, Aug. 2000, pp. 1067-1069.
'Continuously-Tunable Single-Frequency Semiconductor Lasers' Coldren et al., IEEE Journal of Quantum Electronics, vol. 23, No. 6, Jun. 1987, pp. 903-908.
'Widely Tunable 1.55-μm Lasers for Wavelength-Division-Multiplexed Optical Fiber Communications' Delorme, IEEE Journal of Quantum Electronics, vol. 34, No. 9, Sep. 1998, pp. 1706-1716.
'Theory of Direct Frequency Modulation of Semiconductor Lasers with Integrated External Cavity' Zhang et al., Journal of Lightwave Technology, vol. 8, No. 1, Jan. 1990, pp. 66-70.
'Broadly Tunable InGaAsP/InP Vertical-Coupler Filtered Laser With Low Tuning Current' Kim et al., Electronic Letters, vol. 29, No. 8, Apr. 1993, pp. 664-666.

* cited by examiner

*Primary Examiner*—Minsun Harvey
*Assistant Examiner*—Sean Hagan
(74) *Attorney, Agent, or Firm*—Ladas & Parry LLP

(57) ABSTRACT

Provided is an integrated semiconductor light source using locking characteristic by an external light injection, including: an active region controlling an optical gain and an optical output by current injection; and a passive region having a structure integrated with the active region and moving a cavity mode by current injection or voltage application to lock injection light.

14 Claims, 6 Drawing Sheets

A

OPTICAL GAIN $$\Delta\lambda_a = \frac{\lambda^2}{2n_{ag}L_a}$$

WHEN $I_p$ INCREASES

B $$\Delta\lambda_p = \frac{\lambda^2}{2n_{pg}L_p}$$

C $$\Delta\lambda = \frac{\lambda^2}{2(n_{a\_g}L_a + n_{p\_g}L_p)}$$

INTEGRATED SEMICONDUCTOR LIGHT SOURCE

CROSS-REFERENCE TO RELATED APPLICATION

This application claims priority to and the benefit of Korean Patent Application No. 2004-105678, filed Dec. 14, 2004, the disclosure of which is incorporated herein by reference in its entirety.

BACKGROUND

1. Field of the Invention

The present invention relates to an integrated semiconductor light source which uses locking characteristics by external light injection and has an active region and a passive region.

2. Discussion of Related Art

Recently, demand for data service, for example, through the Internet is increasing, and due to new multimedia service such as an HDTV, an electronic commerce, a VOD, and a video conference, a need for sufficient data traffic is raised, so that severe research on a passive optical network (PON) which directly couples an optical fiber to respective subscribers from a central office (CO) is being performed.

In the PON, except for a transceiver, an outside network which couples the central office to the respective subscribers is comprised of passive optical elements such as an optical fiber, a distributor or a multiplexer/demultiplexer, and it does not need an additional power source and, thus there are advantages in that it is easy to maintain it and communication capacity can be increased or new communication service can be provided by just replacing a transceiving module. In the PON, a method that communication between the central office and the subscriber is performed using an intrinsic wavelength allocated to each subscriber is referred to as a wavelength division multiplexing passive optical network (WDM-PON).

The WDM-PON includes a distributed feedback laser diode (DFB-LD) array, a wavelength-tunable laser diode, a multi-wavelength laser diode, or a spectrum slicing type incoherent light source as an optical line terminal (OLT) light source which is responsible for data transmission from/to the central office.

The DFB-LD array, the wavelength-tunable laser diode and the multi-wavelength laser diode are ones which are integrated such that light of various wavelengths is emitted from one module and have advantages in that an oscillation characteristic is excellent, a side mode suppression ratio (SMSR) is high, and a spectral line width is narrow. But the DFB-LD array, the wavelength-tunable laser diode and the multi-wavelength laser diode have complicated manufacturing processes and so have high manufacturing cost. Because of such an economic reason, the spectrum slicing type incoherent light source attracts public attention.

The incoherent light sources such as a light emitting diode (LED), a super luminescent diode (SLD), and an amplified spontaneous emission (ASE) have a wide spectrum and are being employed in a wavelength division multiplexing optical transmission device as a method (i.e., spectrum splicing type) of obtaining a light source having several wavelengths by using an arrayed waveguide grating (AWG).

As an optical network terminal (ONT) light source, many suggestion and reports have been introduced, but a loop back method and an injection locking method are mainly employed. A method of generating a single mode optical output using an injection locking characteristic of a fabry-perot laser diode (FP-LD) will be described below for comparison with the structure of a light source of the present invention.

FIGS. 1A and 1B are views illustrating a cavity mode characteristic and a locking characteristic of injected light of a conventional FP-LD. As shown in FIG. 1A, the cavity modes of the laser are determined by an optical gain characteristic and a cavity length L of a laser material. Here, an interval between the cavity modes is $\Delta\lambda$, where $\lambda$ is a wavelength, and $n_g$ is a group refractive index. Output on the respective cavity modes is in proportion to the magnitude of spontaneous emission coupled to the respective cavity modes.

In the characteristics of the laser diode described above, as shown in FIG. 1B, if light is artificially injected to a certain wavelength from an external portion, an optical output in the injected wavelength is increased. Here, an output in the rest wavelength other than the injected wavelength is decreased due to the injection locking characteristic, so that a single mode light source having the high SMSR can be obtained.

With respect to the wavelength of the injection light, the injection locking characteristic sensitively varies according to the cavity mode characteristic of the FP-LD, and thus it has the following problems.

Firstly, when the single mode light source of the injection locking method is implemented, the spectrum-sliced injection light is actually difficult to match the cavity mode of the laser. Thus, as shown in FIG. 2A, if the injection light is misaligned with the cavity mode wavelength (corresponding to a crest), the injection locking characteristic is significantly decreased.

Secondly, for the first reason described above, a structure of increasing mode selectivity for the injection light by increasing the cavity length to narrow the cavity mode interval can be used. However, if the spectrum width of the injection light is relatively greater than the cavity mode length as shown in FIG. 2B, the two modes beat against each other, so that it is impossible to obtain the single mode characteristic.

Thirdly, for the first reason described above, the cavity mode length can be adjusted by controlling temperature of the FP-LD with respect to the wavelength of the injection light. This method is disclosed in Korean Patent Application Nos. 10-2002-0057223 entitled "Temperature control method for automatical wavelength-locking of a Fabry-Perot laser diode to the wavelength of the injected incoherent light" and 10-2003-0008099 entitled "Wavelength-tunable light source and wavelength-division multiplexed transmission system with the sources".

However, the method of turning the wavelength of the injection light by temperature adjustment needs high-price parts such as a thermo-electric cooler (TEC) and an automatic temperature controller (ATC), and thus cost is high. The method using the temperature adjustment is also slow in speed, and when temperature is increased, the optical gain of the FP-LD is decreased, whereby the optical output characteristic is degraded.

Fourthly, for the first reason described above, the wavelength of the injection light can be turned by adjusting an injection current of the FP-LD. This method is disclosed in Korean Patent Application No. 10-2003-0008099 entitled "Wavelength-tunable light source and wavelength-division multiplexed transmission system with the sources".

However, if the injection current is adjusted in a case where the operating current of the FP-LD is lower than the threshold current, the optical output may be changed due to the variation of the optical gain. In a case where the operating current of the FP-LD is greater than the threshold current, even if the current is increased, since carrier density in the laser is barely changed, the refractive index is barely changed, whereby it is difficult to tune the wavelength.

For the foregoing reasons, the FP-LD using the injection locking characteristic has difficulties in employing as the ONT light source of the WDM-PON.

In the FP-LD of the injection locking method which is used as the ONT light source in the conventional WDM-PON, if it is put to practical use, since the wavelength of the injection light is difficult to exactly match the cavity mode of the laser, the injection locking characteristic is degraded, and even though the cavity length is increased to increase locking selectivity to the injection light, the two modes are beaten, thereby degrading the locking characteristic.

In the conventional art, the method of turning the wavelength of the injection light by adjusting the temperature or current of the FP-LD has been suggested, but it has disadvantages in that speed is slow and an optical output is greatly changed.

SUMMARY OF THE INVENTION

The present invention is directed to an integrated semiconductor light source having a new structure.

The present invention is also directed to an integrated semiconductor light source which is very excellent in side mode suppression ratio (SMSR) and noise characteristic and can be used as a single mode light source.

The present invention is also directed to a light source which does not need a temperature control device and is low in cost and thus is suitable for an ONT light source.

One aspect of the present invention is to provide an integrated semiconductor light source using locking characteristic by external light injection, including: an active region controlling an optical gain and an optical output by current injection; and a passive region having a structure integrated with the active region and moving a cavity mode by current injection or voltage application to lock injection light.

Preferably, an integrated semiconductor light source is provided in which the passive region is arranged at one or both sides of the active region, such that a refractive index of the passive region is changed by current injection or voltage application to control a cavity mode. More preferably, the integrated semiconductor light source has a structure that makes an effective refractive index of the passive region different from that of the active region such that a part of guided light is reflected at an interface between the passive region and the active region by a refractive index difference between both regions. The reflection at the interface more improves wavelength selectivity. There are several methods of varying the effective refractive index of the passive region to control the reflection.

Firstly, if composition or thickness of a material of a core layer in the passive region is controlled, the effective refractive index is varied, whereby the reflection occurs at the interface. Secondly, the reflection can be controlled by making a waveguide width of the passive region different from that of the active region. Thirdly, in a case where a waveguide structure of the passive region is different from that of the active region, the effective refractive index is varied, so that the reflection occurs. In the third method, for example, the passive region can be a deep ridge structure in a case where the active region is a shallow ridge structure, the passive region can be a shallow or deep ridge structure in a case where the active region is a buried ridge structure, or the passive region can be a shallow, deep or buried ridge structure in a case where the active region is a buried heterostructure structure. Among the three methods of controlling the effective refractive index of the passive region to control the reflection, one method can be independently used or combination of two or three methods can be used.

Preferably, the integrated semiconductor light source is employed as an ONT light source in WDM-PON. Meanwhile, in a case where the wavelength of the injection light is injected to the ONT at a channel interval for each channel, it is preferred that the cavity length of the passive region is manufactured such that the cavity mode interval of the passive region is identical to the wavelength channel interval of the injection light.

Another aspect of the present invention is to provide an integrated semiconductor light source, including: an active region arranged on a substrate and a passive region arranged to be separated apart from the active region, wherein the active region includes an active layer surrounded by a first clad layer and electrodes for injecting a current to an active layer, and the passive region includes a core layer for transferring light to the active layer, a second clad layer and electrodes for injecting a current to the core layer.

In the passive region, the oscillation mode is moved by the current injection or the voltage application, and in the active region, the optical gain and the optical output can be controlled by the current injection.

BRIEF DESCRIPTION OF THE DRAWINGS

The above and other features and advantages of the present invention will become more apparent to those of ordinary skill in the art by describing in detail exemplary embodiments thereof with reference to the attached drawings in which.

DETAILED DESCRIPTION OF PREFERRED EMBODIMENTS

The present invention will now be described more fully hereinafter with reference to the accompanying drawings, in which exemplary embodiments of the invention are shown. This invention may, however, be embodied in different forms and should not be construed as limited to the embodiments set forth herein. Rather, these embodiments are provided so that this disclosure is thorough and complete and fully conveys the scope of the invention to those skilled in the art.

Figure 1A:
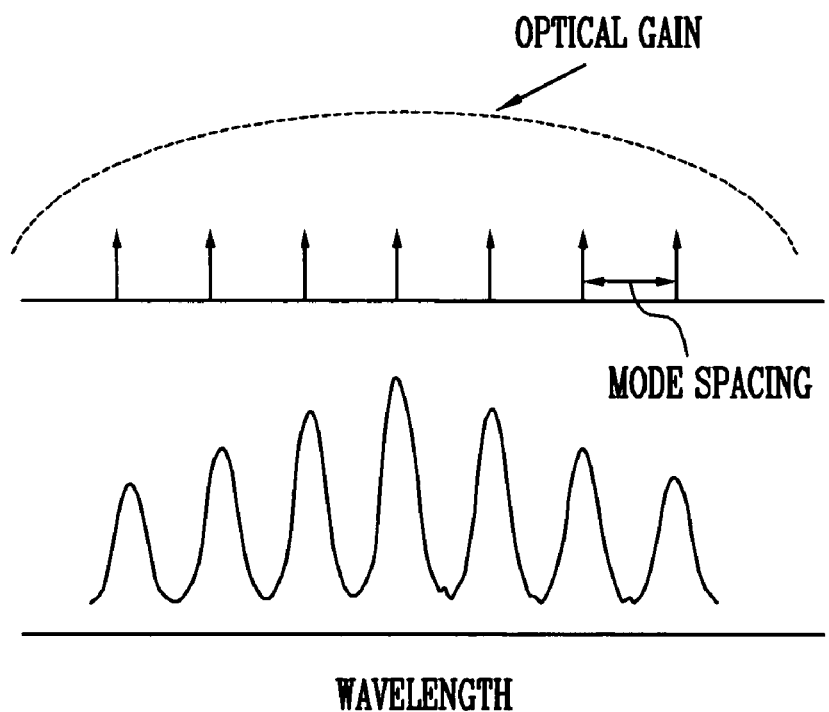
FIGS. 1A and 1B are views illustrating a cavity mode characteristic and a locking characteristic of injected light of a conventional FP-LD.
Figure 1B:
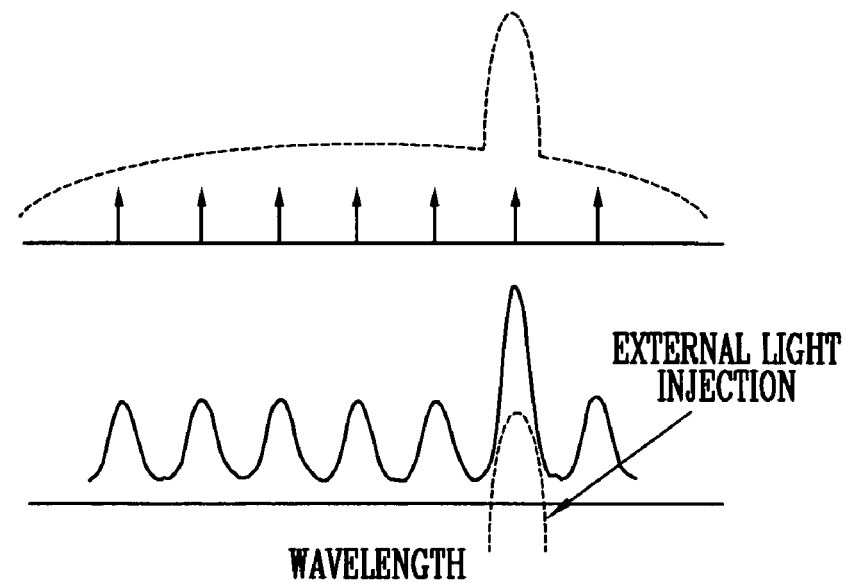
Figure 2A:
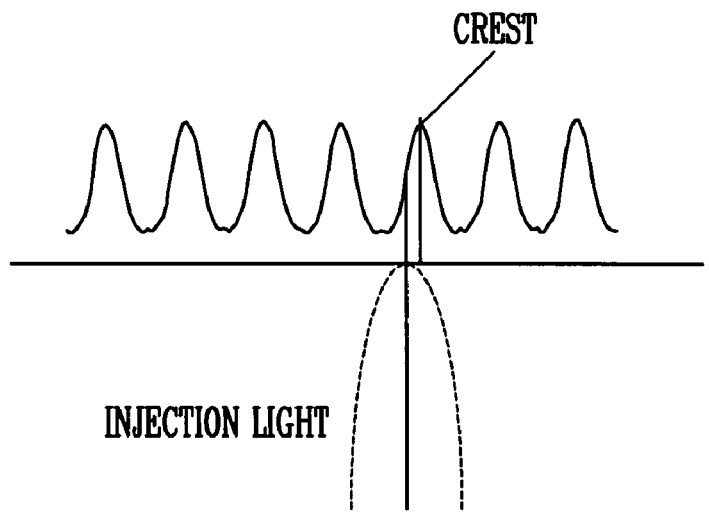
FIGS. 2A and 2B are conceptual views illustrating problems of an injection locking characteristic of the conventional FP-LD.
Figure 2B:
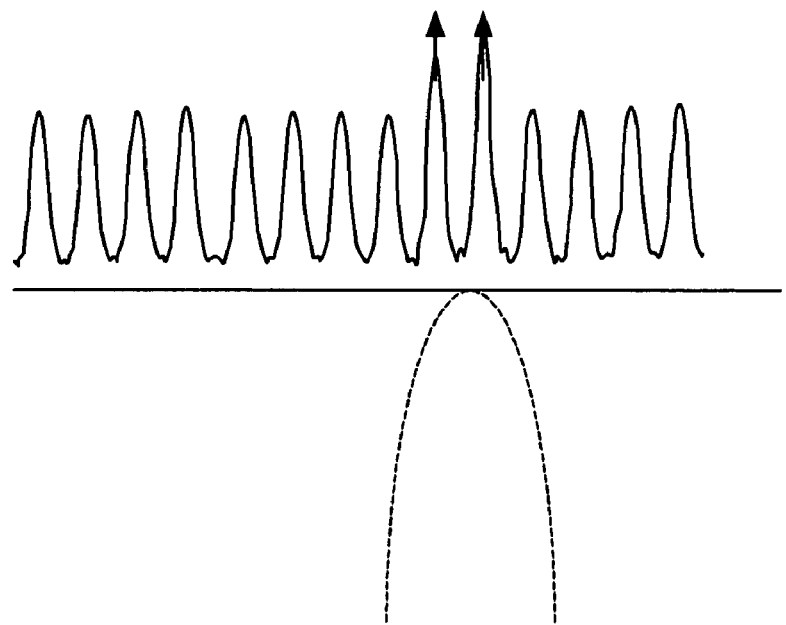
Figure 3:
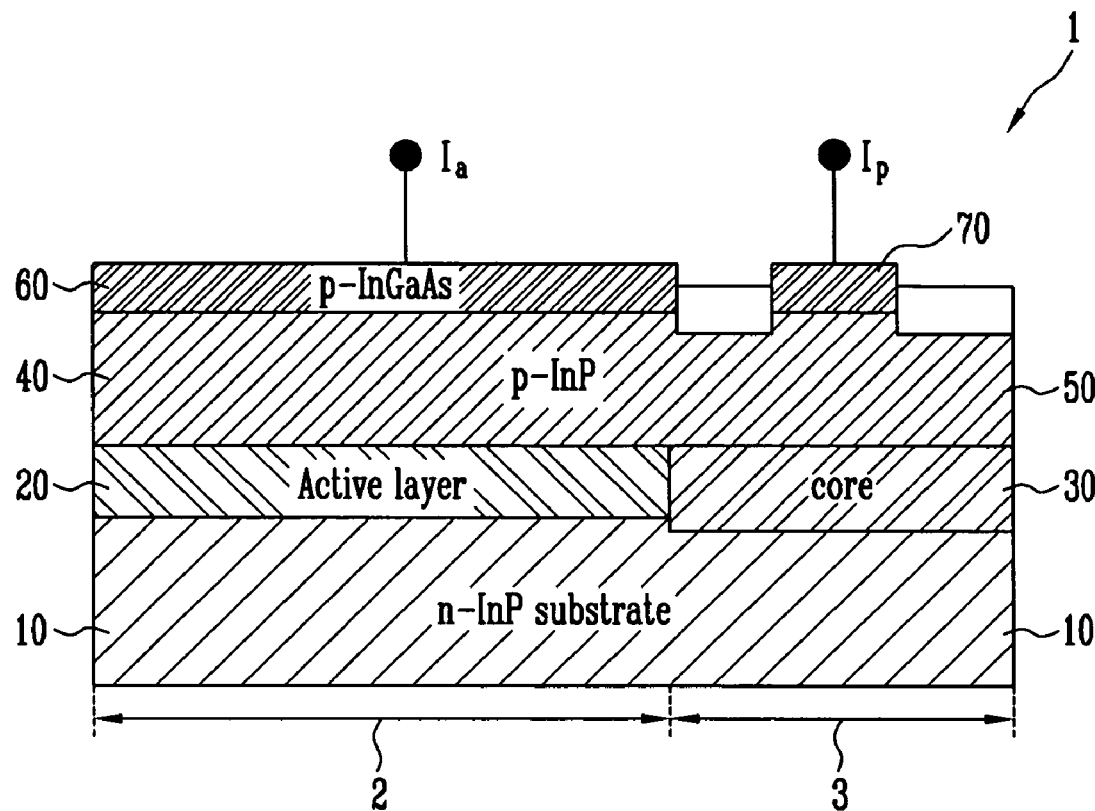
FIG. 3 is a schematic view illustrating an integrated semiconductor light source according to an exemplary embodiment of the present invention.

FIG. 3 is a schematic view illustrating an integrated semiconductor light source according to an exemplary embodiment of the present invention.

Referring to FIG. 3, the integrated semiconductor light source of the present invention includes an active region 2 and a passive region 3. The active region 2 provides an optical gain according to the current injection. The passive region 3 has a structure integrated with the active region 2 and varies a refractive index of guided light by injecting a current (i.e., applying a voltage) to move a common mode.

According to the present invention, it is possible to match a wavelength of the injection light by moving the common mode by the current injection of the passive region 3, and thus the problems of the conventional art can be easily overcome. By designing length of the passive region such that a common mode interval of the passive region 3 can be identical to a channel interval of the injection light using the reflective characteristics at the interface between the active region 2 and the passive region 3, the injection locking can be performed by only wavelength corresponding to the crest of the oscillation mode of the passive region 3 with respect to all ONTs in a case where the integrated semiconductor light source of the present invention is employed as an ONT light source of a WDM-PON. Therefore, the integrated semiconductor light source of the present invention has excellent SMSR and noise characteristics. In particular, the integrated semiconductor light source of the present invention can be used as wavelength-variable single mode light source since there is no need for an automatic temperature controller.

Hereinafter, configuration of the integrated semiconductor light source 1 of the present invention will be explained in detail with reference to FIG. 3.

Referring to FIG. 3, in the active region 2 of the integrated semiconductor light source 1, an n-doped InP substrate 10, an active layer 20 having a material structure of InGaAsP, and a p-doped InP layer 40, a p-doped InGaAs layer 60 are sequentially staked. The active layer 20 is formed by appropriately controlling the amount of indium (In):gallium (Ga) and arsenide (As):phosphorus (P) by using an injection current Ia such that the optical gain is generated at, for example, 1.55 μm.

In a passive region 3 of the integrated semiconductor light source 1, the n-doped InP substrate 10, a core layer 30 made of InGaAsP, a p-doped InP layer 50, and a p-doped InGaAs layer 70 are sequentially stacked. The core layer 30 is made of a material, e.g., InGaAsP, which has high bandgap energy such that light having a wavelength of about 1.55 μm can be guided with a small loss, and due to injection of a current Ip, a refractive index of the material is changed, so that the wavelength of the oscillation mode is changed. The p-doped InGaAs layer is partially etched to be separated into reference numeral 60 and reference numeral 70 in order to electrically separate the active region 2 and the passive region 3.

In the integrated semiconductor light source, due to a difference of the effective refractive index between the active region 2 and the passive region 3, reflection can be generated at an interface between the active region 2 and the passive region 3. Composition, thickness, width, and waveguide structure of materials of the active layer 20 and the core layer 30 can be adjusted to thereby adjust transmittance and reflectance.

Figure 4A:
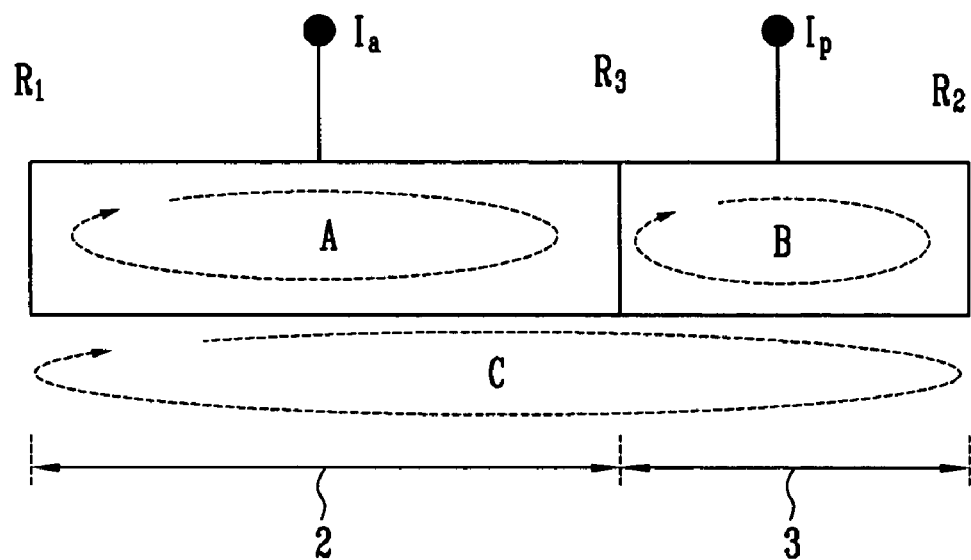
FIG. 4A is a conceptual view illustrating a resonance characteristic of the integrated semiconductor light source of FIG. 3.

Next, an internal resonance characteristic of the integrated semiconductor light source 1 will be described below. FIG. 4A is a conceptual view illustrating a resonance characteristic of the integrated semiconductor light source of FIG. 3, and FIG. 4B is a conceptual view illustrating an optical spectrum characteristic of the integrated semiconductor light source.

Figure 4B:
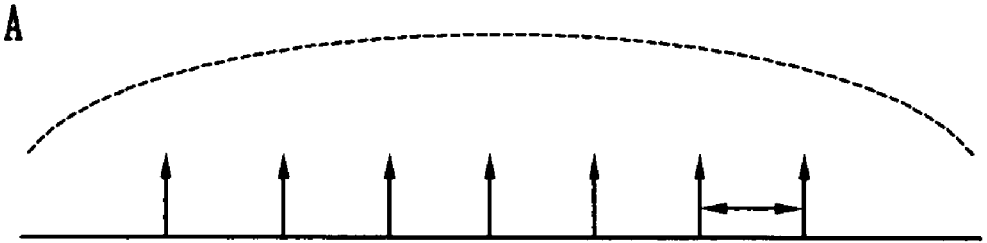
FIG. 4B is a conceptual view illustrating an optical spectrum characteristic of the integrated semiconductor light source.
Figure 4B:
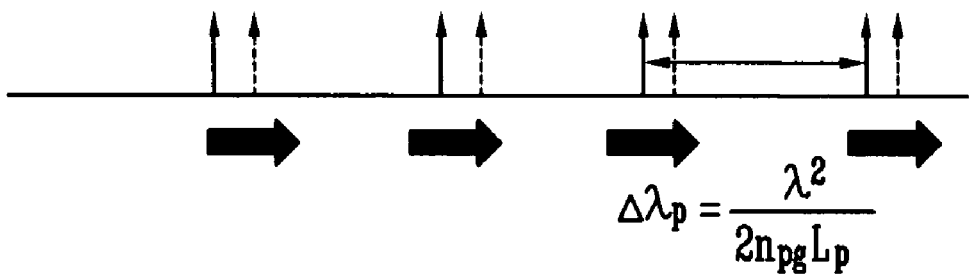
Figure 4B:
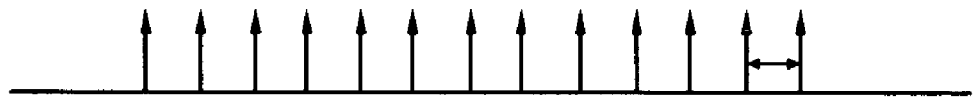

Due to internal reflection at the interface between the active region 2 and the passive region 3, three (3) kinds of resonance characteristics A, B and C work compositely, and in FIG. 4B, it is assumed that a resonance length La of the active region 2 is longer than a resonance length Lp of the passive region 3, and so a mode interval Δλa of the active region 2 is shown to be shorter than a mode interval Δλp of the passive region 3.

The mode interval Δλa of the active region 2 is defined as Equation 1:

$$\Delta\lambda_a = \frac{\lambda^2}{2n_{ag}L_a} \qquad \text{[Equation 1]}$$

where $n_{ag}$ denotes a group refractive index of the active region 2 according to the current Ia, La denotes a length of the active region 2, and λ denotes an optical wavelength.

The mode interval Δλp of the passive region 3 is defined as Equation 2:

$$\Delta\lambda_p = \frac{\lambda^2}{2n_{pg}L_p} \qquad \text{[Equation 2]}$$

where $n_{pg}$ denotes a group refractive index of the passive region 3 according to the current Ip, Lp is a length of the passive region 3, and λ is an optical wavelength.

In this structure, if there is no internal reflection $R_3$, the optical gain characteristic of the active region 2 is added to the mode characteristic, and if there exists the internal reflection $R_3$, affections of the resonance characteristics A and B overlap, causing variation of the optical gain. In FIG. 4B, the effective refractive index is changed due to the injection of the current Ip of the passive region 3, and thus the wavelength of the oscillation mode moves.

EXPERIMENTAL EXAMPLE

Figure 5A:
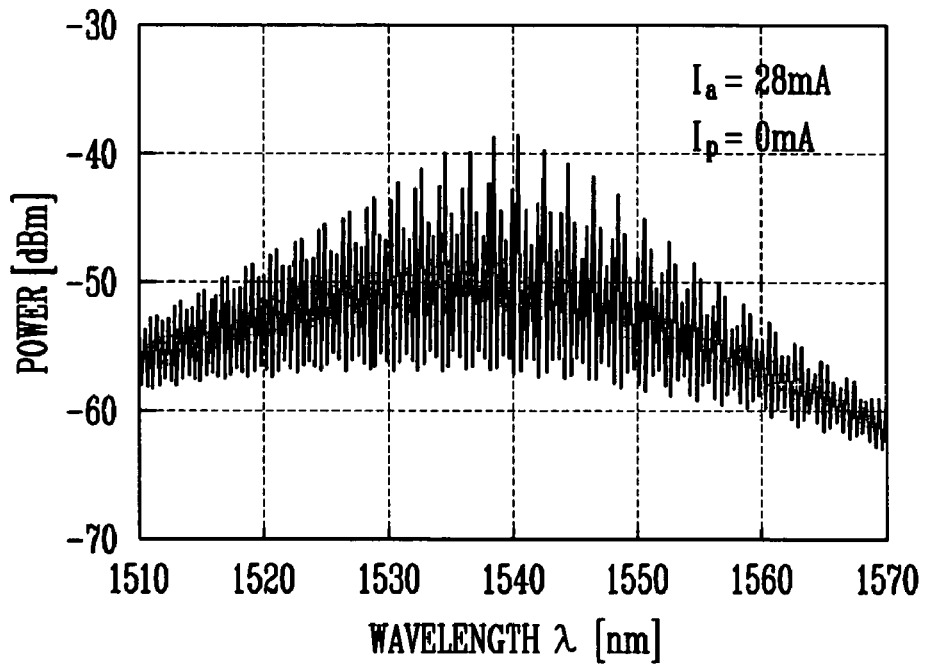
FIGS. 5A and 5B are graphs illustrating optical output spectra of the integrated semiconductor light source of FIG. 3.
Figure 5B:
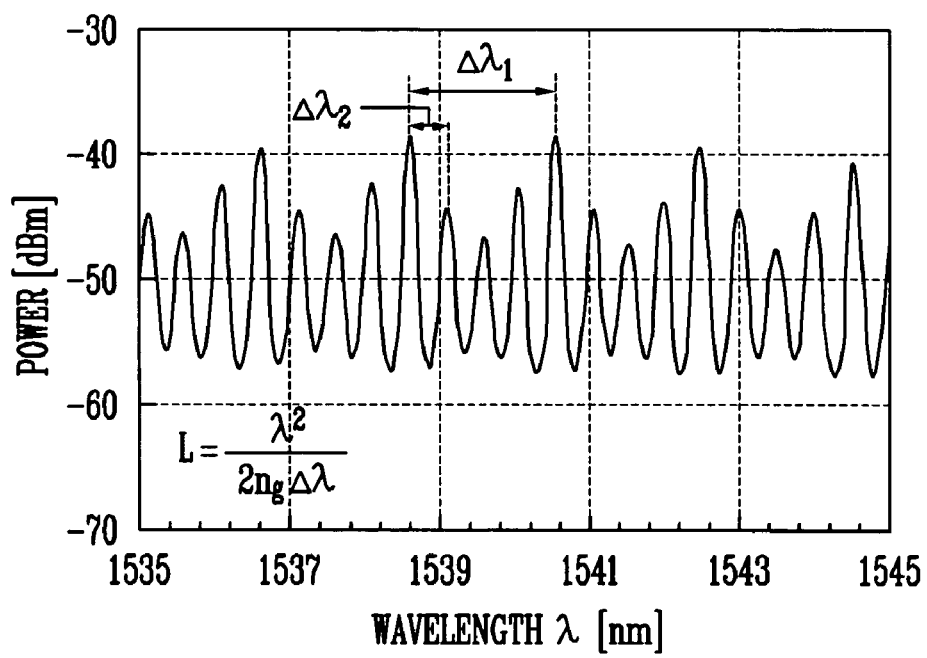

Experimentation of verifying the structure of the integrated semiconductor light source described above was performed. FIGS. 5A and 5B are graphs illustrating optical output spectra of the integrated semiconductor light source of FIG. 3. Experimental condition is as follows. The integrated semiconductor light source was manufactured to have a length La of the active region of 500 μm and a length Lp of the passive region of 160 μm. The threshold current was 33 mA, and a current of 28 mA was injected into the active region.

The optical spectrum obtained in the experimentation is such that envelope distribution in the entire spectrum represents a Gaussian characteristic, and the envelope is being modulated at a wavelength interval of about 2 nm due to affection of the internal reflection. Since the injection current is lower than the threshold current, it represents Gaussian distribution, and if the current is injected at a level higher than the threshold current, it represents Lorentzian distribution. Also, the envelope shape according to the injection current does not affect the spectrum characteristic of the present invention, and a description on the spectrum characteristic is omitted when the injection current is higher than the threshold current.

FIG. 5B is a graph illustrating a certain spectrum range of the spectrum of FIG. 5A. In FIGS. 5A and 5B, a wide mode interval $\Delta\lambda_1$ and a narrow mode interval $\Delta\lambda_2$ were measured as 2 nm and 0.5 nm, respectively. Assuming that the group refractive indexes of the active region and the passive region are in a range of 1.54 μm to 3.6 μm, lengths of the active region and the passive region are 160 μm and 660 μm, respectively.

As a result of the measurement, $\Delta\lambda_1$ denotes an oscillation mode interval of the passive region, and $\Delta\lambda_2$ denotes an oscillation mode interval of the whole region.

Figure 6:
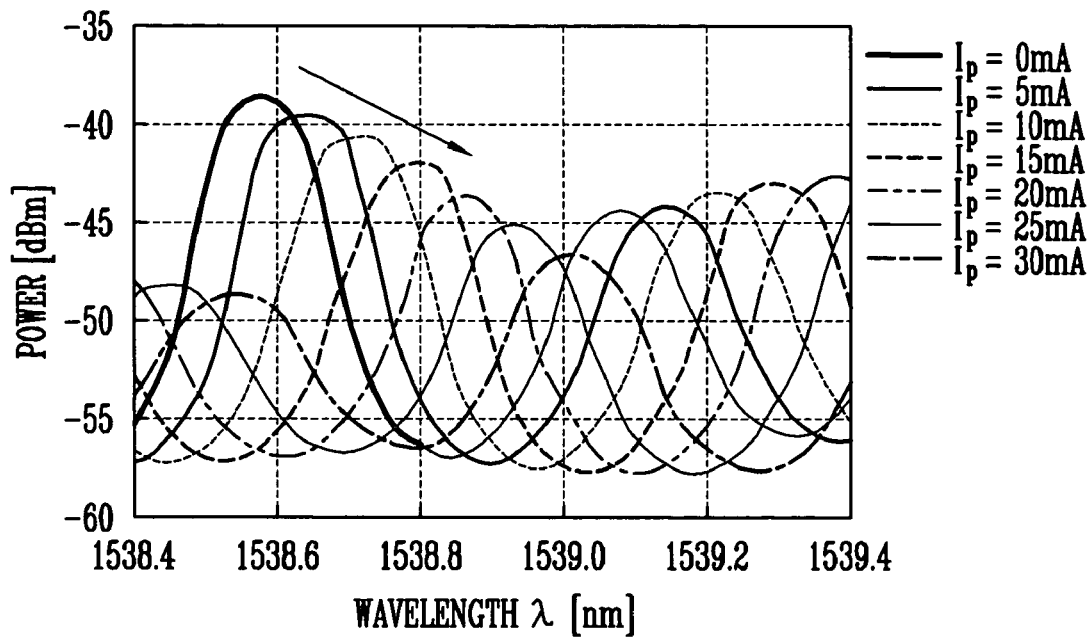
FIG. 6 is a graph illustrating a wavelength-tunable characteristic according to the injection current of a passive region in the integrated semiconductor light source of FIG. 3.

FIG. 6 is a graph illustrating a wavelength-tunable characteristic according to the injection current of a passive region in the integrated semiconductor light source of FIG. 3. That is, FIG. 6 shows the optical output spectrum when in the manufactured integrated semiconductor optical resource, the current Ia of the active region is 28 mA, and the current Ip of the passive current is increased from 0 mA to 30 mA by unit of 5 mA.

It is shown that as the current of the passive region increases, the oscillation mode moves to a long wavelength, and it is possible to exactly match the wavelength of the injection light by adjusting the injection current of the passive region. As the current of the passive region increases, optical loss increases and thus the optical output becomes somewhat low, but the optical output can be increased by increasing the current of the active region, and so this is not the problem.

Meanwhile, in a case where the channel interval of the injection light is 0.8 nm (100 GHz) in the arrayed waveguide grating (AWG), if the length of he passive region is manufactured to be 400 μm, the oscillation mode interval $\Delta\lambda_1$ is about 0.8 nm at the wavelength of 1.54 μm by an Equation 3. Thus, in a case where the integrated semiconductor light source is used as the ONT light source of the WDM-PON, the current of the passive region can be controlled so that the injection locking can be performed by only wavelength corresponding to the crest of the oscillation mode of the passive region with respect to all ONTs.

The Equation 3 is defined as:

$$\Delta\lambda = \frac{\lambda^2}{2n_g L} \quad \text{[Equation 3]}$$

Therefore, in a case where there exists reflection at an interface between the active region and the passive region, since a peak of the gain appears in the cavity mode of the passive region, it is possible to tune the cavity mode of the passive region to the wavelength of the injection light by the current injection of the passive region, leading to high SMSR.

As a result, there is no need for the thermoelectric cooler (TEC) and the automatic temperature controller (ATC), and only the driving circuit is needed, and thus the integrated semiconductor light source of the present invention can be used as the low-price ONT light source.

Meanwhile, actually optimum condition for the injection locking of the FP-LD appears when the wavelength of the injection light is slightly longer than the wavelength of the FP-LD mode before the injection locking. It is because the carrier density in the active region is decreased by the injection locking and thus the refractive index is increased. As the refractive index is increased, the wavelength of the laser mode is increased. The matter described above can be resolved by the current injection of the passive region.

Wavelength division multiplexing passive optical network (WDM-PON)

Figure 7:
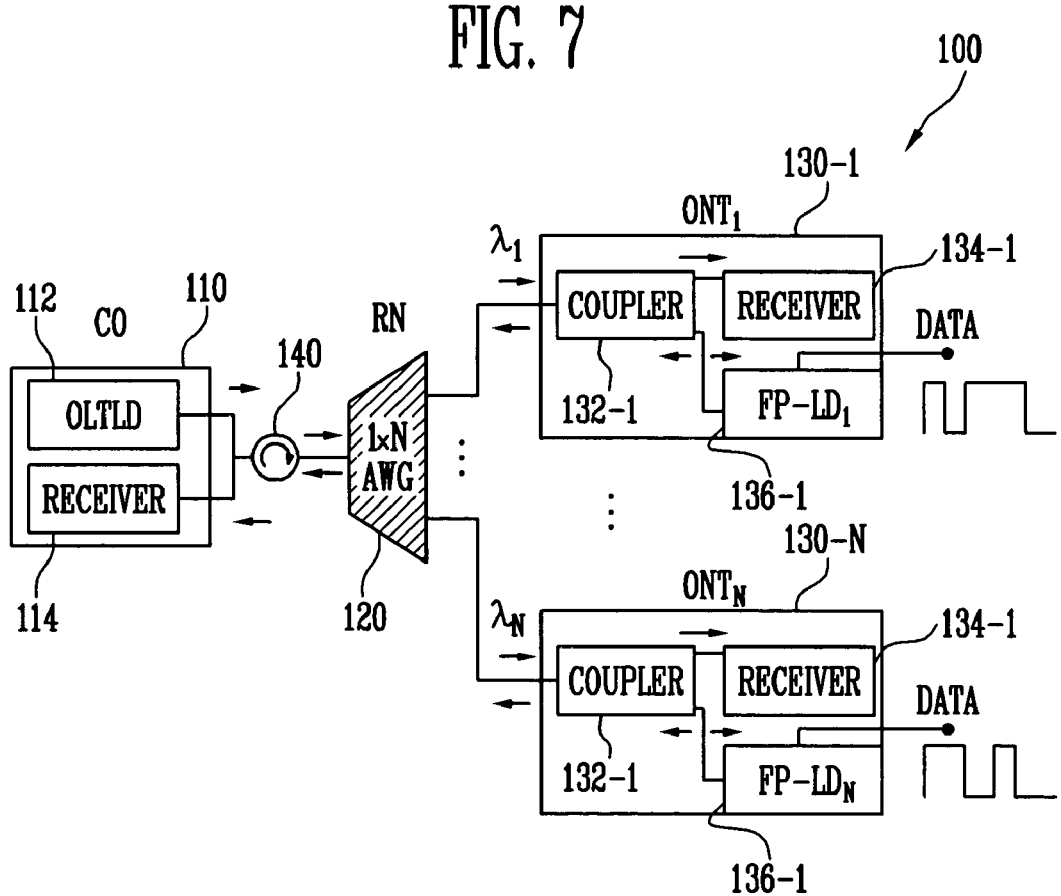
FIG. 7 is a schematic view of a WDM-PON which employs the integrated semiconductor light source according to an exemplary embodiment of the present invention.

FIG. 7 is a schematic view illustrating the WDM-PON which employs the integrated semiconductor light source according to an exemplary embodiment of the present invention.

The WDM-PON 100 includes a central office (CO) 110, a distributor, i.e., remote node RN 120 which performs data distribution or multiplexing/demultiplexing, ONTs 130-1 to 130-N which receive or transmit data in the subscriber. The central office 110 includes an OLT LD 112 and a receiver 114, and each ONT 130-1 to 130-N includes a coupler 132-1 to 132-N, a receiver 134-1 to 134-N, and an integrated semiconductor light source 136-1 to 136-N. The WDM-PON 100 may further include an optical circulator 140.

Here, a beam emitted from the OLT LD 110 is spectrum-sliced by the AWG in the distributor 120 and then is transmitted to the ONTs 130-1 to 130-N. The wavelength interval of the spectrum-sliced beams is determined by the channel interval of the AWG. The channel interval of the AWG is usually 0.8 nm for a dense wavelength division multiplexing (DWDM) communication. The beams incident to the ONTs 130-1 to 130-N are transferred to the receivers 134-1 to 134-N and the integrated semiconductor light sources 136-1 to 136-N through the couplers 132-1 to 132-N, respectively.

In the case where the channel interval of the injection light is 0.8 nm, the current of the passive region can be controlled such that the injection locking can be performed by only wavelength corresponding to the crest of the oscillation mode of the passive region with respect to all ONTs. Also, since the optical gain becomes maximum in the oscillation mode of the passive region when there exists reflection at the interface between the active region and the passive region, it is possible to tune the oscillation mode of the passive region to the wavelength of the injection light by the current injection of the passive region, leading to high SMSR.

As described herein before, the oscillation mode is moved to allow the wavelength of the injection light to be tuned by the current injection of the passive region, thereby resolving the problems of the conventional art.

In the case where the mode interval of the passive region is designed to have the same as the channel interval of the injection light using the internal reflection characteristic between the active region and the passive region, the injection current can be controlled such that the injection locking can be done by the wavelength corresponding to the crest of the oscillation mode of the passive region, and thus the integrated semiconductor light source can be used as a single mode light source which is excellent in SMSR and noise characteristic.

Also, since the integrated semiconductor light source of the present invention does not need the temperature control device, it can be used as a low-price ONT light source.

Although exemplary embodiments of the present invention have been described with reference to the attached drawings, the present invention is not limited to these embodiments, and it should be appreciated to those skilled in the art that a variety of modifications and changes can be made without departing from the spirit and scope of the present invention.

What is claimed is:

1. An integrated semiconductor light source using a locking characteristic by external light injection, comprising:
    an active region comprising a non-corrugated active layer controlling an optical gain and an optical output by current injection; and
    a passive region comprising a core and having a structure integrated with the active region and moving a cavity mode by current injection or voltage application to lock external light injection;
    wherein the semiconductor light source receives an injected external light wavelength signal;
    wherein the current injection or voltage application applied to the passive region moves the cavity mode matching the cavity mode with the injected external light wavelength signal and locking external light injection; and
    wherein the current injection to the active region and the current injection or voltage application to the passive region are such that when optical loss increases due to the increase in current or voltage application to the passive region, the optical output is increasable by increasing the current injection of the active region.

2. The integrated semiconductor light source of claim 1, wherein the passive region is arranged at least one side of the active region.

3. The integrated semiconductor light source of claim 1, wherein the active region is arranged on a substrate, and the passive region is arranged to be separated apart from the active region, the active region including the non-corrugated active layer surrounded by a first clad layer and electrodes for injecting a current to the non-corrugated active layer, and wherein the passive region including a core layer for transferring light to the active layer, and a second clad layer and electrodes for injecting a current (applying a voltage) to the core layer.

4. The integrated semiconductor light source of claim 1, wherein the oscillation mode is moved by the current injection or the voltage application in the passive region, and the optical gain and the optical output is controlled by the current injection in the active region.

5. The integrated semiconductor light source of claim 1, being used as an optical network terminal (ONT) light source in a wavelength division multiplexing passive optical network (WDM-PON).

6. The integrated semiconductor light source of claim 1, wherein a cavity length of the passive region is designed such that an interval of the cavity mode is substantially identical to a channel interval between channels of a plurality of channels of the injection light.

7. The integrated semiconductor light source of claim 1, wherein the passive region is different in effective refractive index from the active region, such that a part of guided light is reflected at an interface between the active region and the passive region.

8. The integrated semiconductor light source of claim 7, wherein composition or thickness of a material of the core layer in the passive region is controlled to vary the effective refractive index to thereby control the reflection.

9. The integrated semiconductor light source of claim 7, wherein the reflection is controlled by making the passive region different in waveguide width from the active region.

10. The integrated semiconductor light source of claim 7, wherein the reflection is controlled by making the passive region different in waveguide structure from the active region.

11. The integrated semiconductor light source of claim 3, wherein the second clad layer is partially etched at the boundary between the active region and the passive region so as to electrically separate the active region from the passive region.

12. The integrated semiconductor light source of claim 1, wherein the non-corrugated active layer and the core layer are contiguous.

13. A single mode light source using a locking characteristic by external injection, comprising:

an integrated semiconductor light source comprising:

an active region comprising a non-corrugated active layer controlling an optical gain and an optical output by current injection; and a passive region comprising a core and having a structure integrated with the active region and moving a cavity mode by current injection or voltage application;

an external light source injecting light into the integrated semiconductor light source such that the integrated semiconductor light source receives an injected external light wavelength signal;

wherein the current injection or voltage application applied to the passive region moves the cavity mode matching the cavity mode with the injected external light wavelength signal and locking external light injection; and wherein the current injection to the active region and the current injection or voltage application to the passive region are such that when optical loss increases due to the increase in current or voltage application to the passive region, the optical output is increasable by increasing the current injection of the active region.

14. The integrated semiconductor light source of claim 1, wherein the thickness of the core is different from the thickness of the non-corrugated active layer.

* * * * *